(12) United States Patent  
Sun

(10) Patent No.: US 9,116,193 B2  
(45) Date of Patent: Aug. 25, 2015

(54) ELECTRONIC DEVICE AND METHOD FOR DETECTING CURRENT LEAKAGE OF ELECTRONIC COMPONENTS IN THE ELECTRONIC DEVICE

(75) Inventor: Jie Sun, Shenzhen (CN)

(73) Assignees: SHENZHEN FUTAIHONG PRECISION INDUSTRY CO., LTD., Shenzhen (CN); Chi Mei Communication Systems, Inc., New Taipei (TW)

( * ) Notice: Subject to any disclaimer, the term of this patent is extended or adjusted under 35 U.S.C. 154(b) by 639 days.

(21) Appl. No.: 13/485,979

(22) Filed: Jun. 1, 2012

(65) Prior Publication Data

US 2013/0162437 A1 Jun. 27, 2013

(51) Int. Cl.

| G08B 21/00 | (2006.01) |
| G08B 23/00 | (2006.01) |
| G01R 19/00 | (2006.01) |
| G01N 27/416 | (2006.01) |
| G01R 11/63 | (2006.01) |
| G01R 31/02 | (2006.01) |
| H04M 1/24 | (2006.01) |
| H04W 52/02 | (2009.01) |

(52) U.S. Cl.  
CPC .............. G01R 31/025 (2013.01); H04M 1/24 (2013.01); H04W 52/0258 (2013.01); H04W 52/0261 (2013.01)

(58) Field of Classification Search  
CPC ..................................................... G01R 19/00  
See application file for complete search history.

(56) References Cited

U.S. PATENT DOCUMENTS

| 2007/0179676 A1* | 8/2007 | Sasaki et al. ................... 700/295 |
| 2008/0258895 A1* | 10/2008 | Yamaguchi ................... 340/455 |
| 2009/0319969 A1* | 12/2009 | Zhang et al. ...................... 716/5 |
| 2010/0131790 A1* | 5/2010 | Zhang et al. ................... 713/340 |

* cited by examiner

*Primary Examiner* — Jennifer Mehmood  
*Assistant Examiner* — Pameshanand Mahase  
(74) *Attorney, Agent, or Firm* — Novak Druce Connolly Bove + Quigg LLP

(57) ABSTRACT

A method for detecting current leakage of electronic components in an electronic device determines a target electronic component that needs to be analyzed for current leakage in response to a user selection. The target electronic component is controlled to enter into a power-off state, and a first current value of the electronic device is acquired from a digital power supply. The target electronic component is activated into a working state, and then is controlled to enter into a sleep state. A second current value of the electronic device is acquired from the digital power supply. It is determined that the current leakage is occurring in the target electronic component, if a first difference between the second current value and the first current value is more than a predetermined value.

18 Claims, 4 Drawing Sheets

Alarm!
The current leakage is
occurring in the target
electronic component.

FIG. 3

ELECTRONIC DEVICE AND METHOD FOR DETECTING CURRENT LEAKAGE OF ELECTRONIC COMPONENTS IN THE ELECTRONIC DEVICE

BACKGROUND

1. Technical Field

Embodiments of the present disclosure relate to current-loss detection technology, and particularly to an electronic device and method for detecting current leakage of electronic components in the electronic device.

2. Description of Related Art

Electronic components in an electronic device (e.g., a mobile phone) may suffer from current leakage. Current leakage may result in unnecessary power consumption of the electronic device. Measuring current through relevant electronic components is one way to reveal current leakage. However, the electronic device has to be connected to one or more measurement devices, such as a computer and an integrated test instrument, for measuring current through the electronic device. It is inconvenient and very imprecise for a user of the electronic device to measure currents through the electronic components, and then determine whether the electronic components are suffering from current leakage.

BRIEF DESCRIPTION OF THE DRAWINGS

FIG. 3 is a schematic diagram of one embodiment of an alarm message provided by current leakage detection system of FIG. 1.

DETAILED DESCRIPTION

All of the processes described below may be embodied in, and fully automated via, functional code modules executed by one or more general purpose electronic devices or processors. The code modules may be stored in any type of non-transitory computer-readable medium or other storage device. Some or all of the methods may alternatively be embodied in specialized hardware. Depending on the embodiment, the non-transitory computer-readable medium may be a hard disk drive, a compact disc, a digital video disc, a tape drive or other suitable storage medium.

Figure 1:
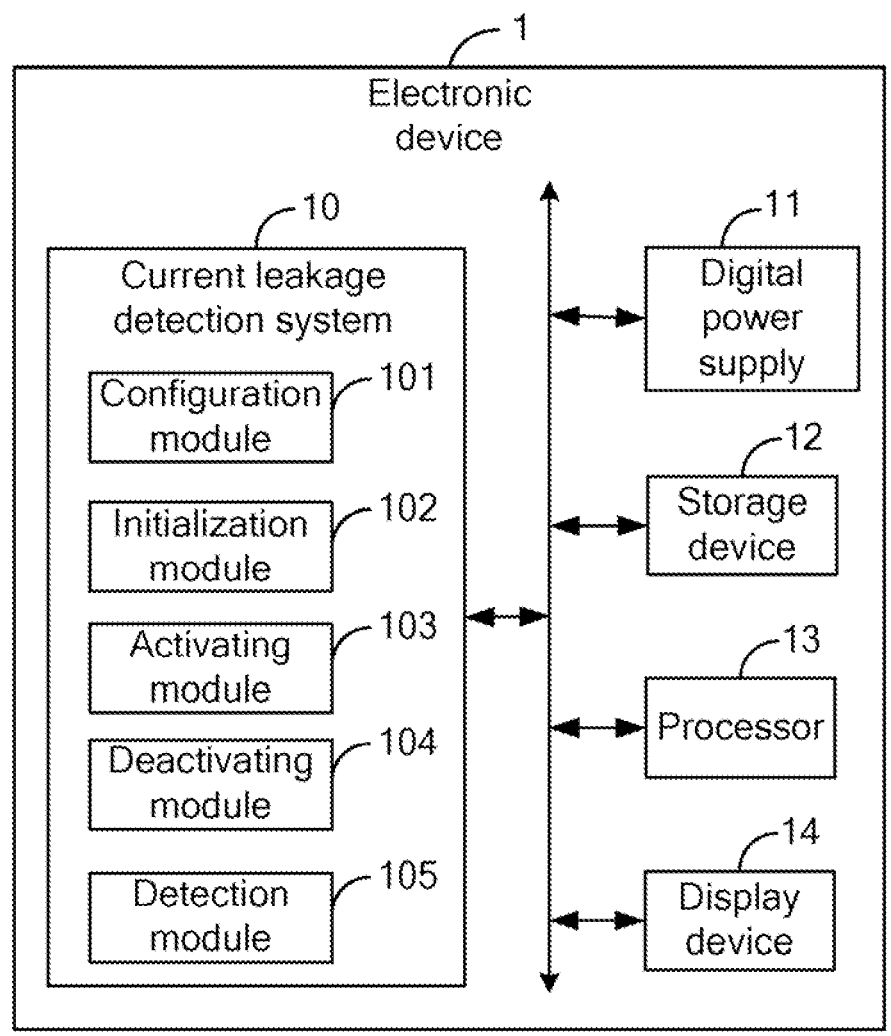
FIG. 1 is a block diagram of one embodiment of an electronic device including a current leakage detection system.

FIG. 1 is a block diagram of one embodiment of an electronic device 1 including a current leakage detection system 10. The electronic device 1 may be a cell phone, a personal digital assistant, a mobile Internet device (MID), a tablet computer, or any other computing device. The electronic device 1 may include a plurality of electronic components not shown in FIG. 1, such as a gravity sensor or a global position system (GPS), for example. In some embodiments, current leakage detection system 10 detects currents through electronic components in the electronic device 1, and determines if current leakage is occurring in one or more electronic components. Current leakage detection system 10 further provides detection results for a user of the electronic device 1.

A detailed description of current leakage detection system 10 will be given in the following paragraphs.

The electronic device 1 includes a power supply suitable for digital operations (e.g., a digital power supply 11), a storage device 12, at least one processor 13, and a display device 14. FIG. 1 illustrates only one example of the electronic device 1 that may include more or fewer components than illustrated, or have a different configuration of the various components. The digital power supply 11 is used to supply power to the electronic device 1, and provide visible parameters for the user. For example, the visible parameters include, but are not limited to, current values (e.g., current quantities read from the digital power supply 11) from different components of the electronic device 1. In the following embodiments, current is a flow of electricity in a circuit. The current value (e.g., a reading of a current quantity) is a value that represents electric current consumed in the electronic device 1.

The storage device 12 provides one or more memory functions. In one embodiment, current leakage detection system 10 may include computerized instructions in the form of one or more programs that are executed by the at least one processor 13 and stored in the storage device 12. The storage device 12 stores one or more programs, such as programs of the operating system, other applications of the electronic device 1, and various kinds of data, such as video and image data. In some embodiments, the storage device 12 may include a memory of the electronic device 1 and/or an external storage card, such as a memory stick, a smart media card, a compact flash card, or any other type of memory card.

The display device 14 may be a liquid crystal display (LCD) or a touch-sensitive display, for example. In some embodiments, the display device 14 may be a touch panel.

In one embodiment, current leakage detection system 10 may include one or more modules, for example, a configuration module 101, an initialization module 102, an activating module 103, a deactivating module 104, and a detection module 105. In general, the word "module", as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable medium include CDs, DVDs, BLU-RAY, flash memory, and hard disk drives.

The configuration module 101 generates a configuration file to detect current leakage of designated electronic components that need to be analyzed for current leakage. In detail, the configuration module 101 presets one or more electronic components that need to be analyzed for current leakage, and writes a component name and an average current value of each of the one or more electronic components into the configuration file.

In some embodiments, the configuration file provides a component list including the one or more electronic components. For example, the one or more electronic components include, but are not limited to a gravity sensor, a luminance sensor, a temperature sensor, a GPS sensor/receiver, a BLUETOOTH module, a proximity sensor, and a WIFI module.

The average current value may be determined according to predetermined parameters provided by a specification of each electronic component. In some embodiments, the user of the electronic device 1 may input the average current value of each electronic component into the configuration file using the configuration module 101.

Figure 2:
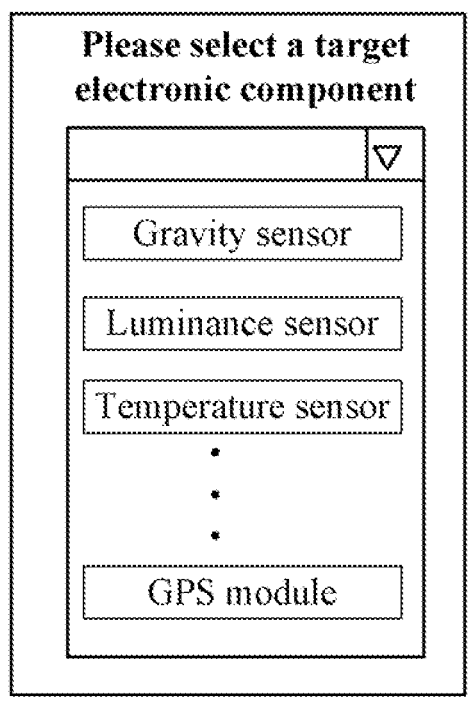
FIG. 2 is a schematic diagram of one embodiment of a component list provided by current leakage detection system of FIG. 1.

The configuration module 101 further displays the component list on the display device 14. Current leakage detection system 10 provides a user interface to input and output relevant data by or for the user. As shown in FIG. 2, the component list is shown on the user interface on the display device 14.

The initialization module 102 determines a target electronic component from designated the electronic components that need to be analyzed for current leakage in response to a user selection. For example, the user may select one of the electronic components in the component list as shown in FIG. 2, and the initialization module 102 determines the electronic component to be analyzed for current leakage in response to the user selection.

The initialization module 102 controls the target electronic component to enter into a power-off state, and acquires a current value "$I_a$" (e.g., 0 ampere) of the electronic device 1 from the digital power supply 11. The current value "$I_a$" represents the current value of the electronic device 1 without running the target electronic component.

In some embodiments, the initialization module 102 may merely disable the target electronic component. For example, the target electronic component is the GPS module, the initialization module 102 may exit the GPS module to make the GPS module in the power-off state. In other embodiments, the initialization module 102 may control the electronic device 1 including all of the electronic components to enter into the power-off state directly.

The activating module 103 activates the target electronic component to enter into a working state, and acquires a current value "$I_b$" of the electronic device 1 from the digital power supply 11. The current value "$I_b$" represents a current value of the electronic device 1 when the target electronic component is running.

The deactivating module 104 controls the target electronic component to enter into a sleep state, and acquires a current value "$I_c$" of the electronic device 1 from the digital power supply 11. "$I_c$" represents a current value of the electronic device when the target electronic component is in the sleep state. In some embodiments, when the target electronic component is in the sleep state, current consumption of the target electronic component ought to be very low, for example, 8 microamperes.

The detection module 105 calculates a first difference between the current value "$I_c$" and the current value "$I_a$", and compares the first difference with a predetermined value (e.g., 10 microamperes). If the first difference is more than the predetermined value, the detection module 105 determines that the current leakage is occurring in of the target electronic component. If the first difference is not more than the predetermined value, the detection module determines that there is no current leakage is occurring in the target electronic component.

If the current leakage is occurring in the target electronic component, the detection module 105 further provides a first alarm message to indicate that the current leakage is occurring in the target electronic component. As shown in FIG. 3, an example of the first alarm message is displayed on the display device 14. In other embodiments, the detection module 105 may output the first alarm message audibly, using a speaker of the electronic device 1.

Moreover, if the current leakage is occurring in the target electronic component, the detection module 105 may highlight the target electronic component in the component list. For example, the detection module 105 may display the component name of the target electronic component in the component list in a specific color different from a single display color of other electronic components.

The detection module 105 generates a detection result in relation to the target electronic component, and displays the detection result on the display device 14.

In other embodiments, the detection module 105 further calculates a second difference between the current value "$I_c$" and the current value "$I_a$". If the second difference is more than the average current value of the target electronic component, the detection module 105 provides a second alarm message to indicate that the target electronic component may be abnormal.

Figure 4:
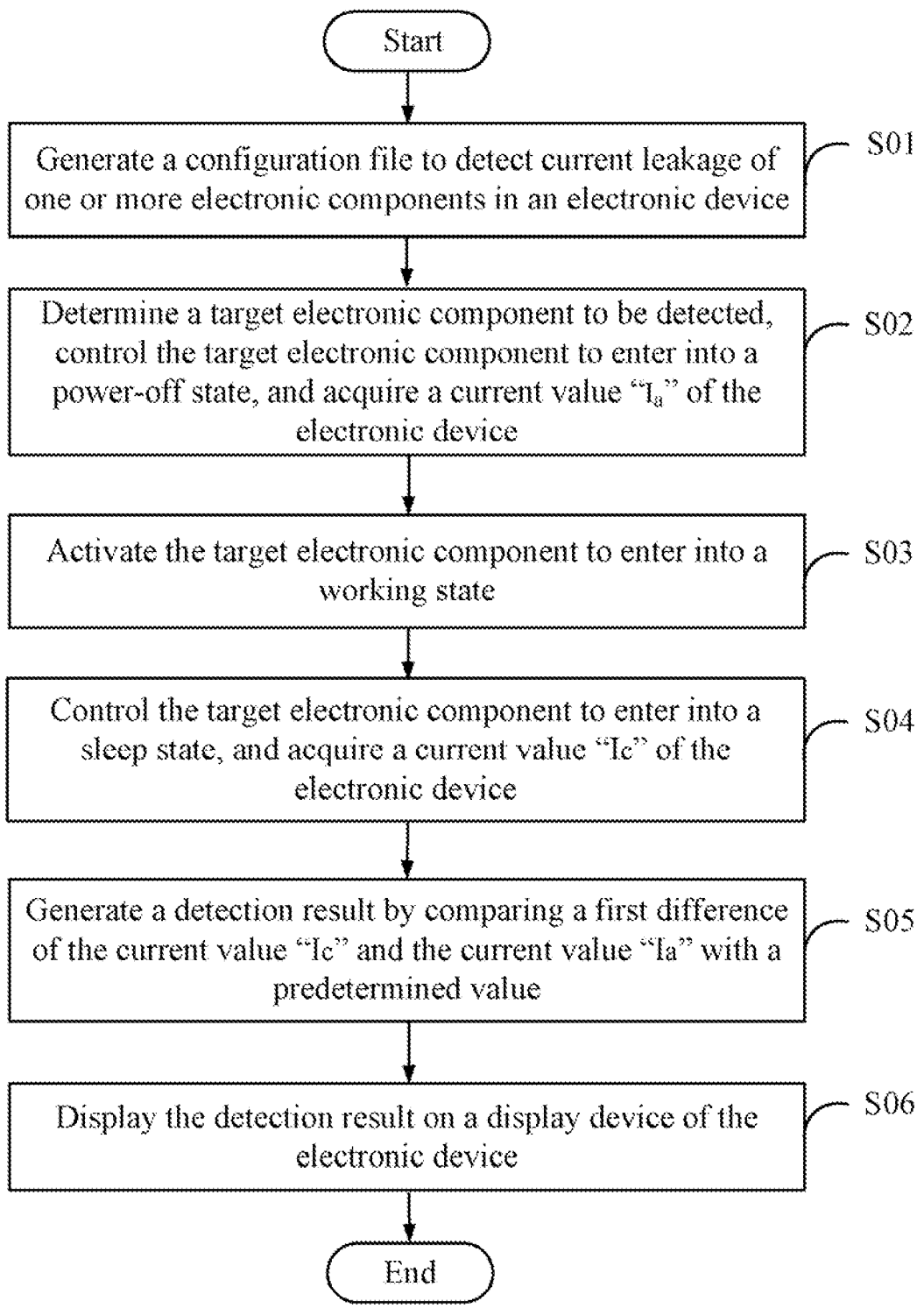
FIG. 4 is a flowchart of one embodiment of a method for detecting current leakage of electronic components in the electronic device using current leakage detection system of FIG. 1.

FIG. 4 is a flowchart of one embodiment of a method for detecting current leakage of electronic components in the electronic device 1 using current leakage detection system 10 of FIG. 1. Depending on the embodiment, additional steps may be added, others moved, and the ordering of the steps may be changed.

In step S01, the configuration module 101 generates a configuration file to detect current leakage of designated electronic components that need to be analyzed for current leakage. As mentioned above, the configuration module 101 presets one or more electronic components that need to be analyzed for current leakage, and writes a component name and an average current value of each of the one or more electronic components into the configuration file.

In step S02, the initialization module 102 determines a target electronic component that needs to be analyzed for current leakage in response to a user selection, controls the target electronic component to enter into a power-off state, and acquires a current value "$I_a$" of the electronic device 1 from the digital power supply 11.

In step S03, the activating module 103 activates the target electronic component to enter into a working state.

In step S04, the deactivating module 104 controls the target electronic component to enter into a sleep state, and acquires a current value "$I_c$" of the electronic device 1 from the digital power supply 11.

In step S05, the detection module 105 generates a detection result by comparing a first difference between the current value "$I_c$" and the current value "$I_a$" with a predetermined value (e.g., 10 microampere). As mentioned above, if the first difference is more than the predetermined value, the detection module 105 determines that current leakage is occurring in the target electronic component. If the first difference is not more than the predetermined value, the detection module determines that current leakage is not occurring in the target electronic component.

In step S06, the detection module 105 displays the detection result on the display device 14 of the electronic device 1.

It should be emphasized that the above-described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure is protected by the following claims.

What is claimed is:
1. A computer-implemented method for detecting current leakage of electronic components in an electronic device comprising a display device, the electronic device being con- nected to a digital power supply, the method comprising execution of the steps comprising:
- determining a target electronic component from one or more electronic components that need to be analyzed for current leakage in response to a user selection;
- controlling the target electronic component to enter into a power-off state, and acquiring a first current value of the electronic device from the digital power supply;
- activating the target electronic component to enter into a working state;
- controlling the target electronic component to enter into a sleep state, and acquiring a second current value of the electronic device from the digital power supply;
- calculating a first difference between the second current value and the first current value; and
- determining that the current leakage is occurring in the target electronic component under the condition that the first difference is more than a predetermined value, and providing a first alarm message to indicate that current leakage is occurring in the target electronic component.

2. The method according to claim 1, further comprising:
- determining that the current leakage is not occurring in the target electronic component under the condition that the first difference is not more than the predetermined value.

3. The method according to claim 1, further comprising:
- acquiring a third current value of the electronic device from the digital power supply under the condition that the target electronic component is in the working state.

4. The method according to claim 3, further comprising:
- calculating a second difference between the third current value and the first current value; and
- providing a second alarm message to indicate that the target electronic component may be abnormal under the condition that the second difference is more than an average current value of the target electronic component.

5. The method according to claim 1, further comprising:
- writing a component name and an average current value of each of the one or more electronic components into a configuration file, which provides a component list comprising the one or more electronic components; and
- displaying the component list on the display device.

6. The method according to claim 5, further comprising:
- highlighting the target electronic component in the component list under the condition that current leakage is occurring in the target electronic component.

7. An electronic device, comprising:
- a digital power supply;
- a display device;
- a storage device;
- at least one processor; and
- one or more modules that are stored in the storage device and executed by the at least one processor, the one or more modules comprising:
- an initialization module that determines a target electronic component from one or more electronic components that need to be analyzed for current leakage in response to a user selection, controls the target electronic component to enter into a power-off state, and acquires a first current value of the electronic device from the digital power supply;
- an activating module that activates the target electronic component to enter into a working state;
- a deactivating module that controls the target electronic component to enter into a sleep state, and acquires a second current value of the electronic device from the digital power supply; and
- a detection module that calculates a first difference between the second current value and the first current value, determines that the current leakage is occurring in the target electronic component under the condition that the first difference is more than a predetermined value, and provides a first alarm message to indicate that current leakage is occurring in the target electronic component.

8. The electronic device according to claim 7, wherein the detection module further determines that the current leakage is not occurring in the target electronic component under the condition that the first difference is not more than the predetermined value.

9. The electronic device according to claim 7, wherein the activating module further acquires a third current value of the electronic device from the digital power supply under the condition that the target electronic component is in the working state.

10. The electronic device according to claim 9, wherein the detection module further calculates a second difference between the third current value and the first current value, and provides a second alarm message to indicate that the target electronic component may be abnormal under the condition that the second difference is more than an average current value of the target electronic component.

11. The electronic device according to claim 7, wherein the one or more modules further comprise a configuration module that writes a component name and an average current value of each of the one or more electronic components into a configuration file, which provides a component list comprising the one or more electronic components, and displays the component list on the display device.

12. The electronic device according to claim 11, wherein the detection module further highlights the target electronic component in the component list under the condition that current leakage is occurring in the target electronic component.

13. A non-transitory storage medium having stored instructions that, when executed by a processor of an electronic device comprising electronic components and a display device, causes the electronic device to perform a method for detecting current leakage of the electronic components, the electronic device being connected to a digital power supply, the method comprising:
- determining a target electronic component from one or more electronic components that need to be analyzed for current leakage in response to a user selection;
- controlling the target electronic component to enter into a power-off state, and acquiring a first current value of the electronic device from the digital power supply;
- activating the target electronic component to enter into a working state;
- controlling the target electronic component to enter into a sleep state, and acquiring a second current value of the electronic device from the digital power supply;
- calculating a first difference between the second current value and the first current value; and
- determining that the current leakage is occurring in the target electronic component under the condition that the first difference is more than a predetermined value, and providing a first alarm message to indicate that current leakage is occurring in the target electronic component.

14. The non-transitory storage medium according to claim 13, wherein the method further comprises:
- determining that the current leakage is not occurring in the target electronic component under the condition that the first difference is not more than the predetermined value.

15. The non-transitory storage medium according to claim 13, wherein the method further comprises:
acquiring a third current value of the electronic device from the digital power supply under the condition that the target electronic component is in the working state.

16. The non-transitory storage medium according to claim 15, wherein the method further comprises:
calculating a second difference between the third current value and the first current value; and
providing a second alarm message to indicate that the target electronic component may be abnormal under the condition that the second difference is more than an average current value of the target electronic component.

17. The non-transitory storage medium according to claim 13, wherein the method further comprises:
writing a component name and an average current value of each of the one or more electronic components into a configuration file, which provides a component list comprising the one or more electronic components; and
displaying the component list on the display device.

18. The non-transitory storage medium according to claim 17, wherein the method further comprises:
highlighting the target electronic component in the component list under the condition that current leakage is occurring in the target electronic component.

* * * * *